United States Patent
Lynam et al.

(10) Patent No.: US 10,289,178 B1
(45) Date of Patent: May 14, 2019

(54) CONFIGURABLE SINGLE EVENT LATCH-UP (SEL) AND ELECTRICAL OVERVOLTAGE STRESS (EOS) DETECTION CIRCUIT

(71) Applicant: Xilinx, Inc., San Jose, CA (US)

(72) Inventors: Adrian Lynam, Meath (IE); John K. Jennings, Dublin (IE); Umanath R. Kamath, Dublin (IE); Michael J. Hart, Palo Alto, CA (US); James Karp, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 225 days.

(21) Appl. No.: 15/479,176

(22) Filed: Apr. 4, 2017

(51) Int. Cl.
| | |
|---|---|
| *G01R 19/00* | (2006.01) |
| *G06F 1/20* | (2006.01) |
| *G05F 1/46* | (2006.01) |
| *H03K 17/22* | (2006.01) |
| *H03K 19/003* | (2006.01) |
| *G01R 19/165* | (2006.01) |
| *G01K 13/00* | (2006.01) |

(52) U.S. Cl.
CPC .............. *G06F 1/206* (2013.01); *G01K 13/00* (2013.01); *G01R 19/16576* (2013.01); *G05F 1/468* (2013.01); *H03K 17/223* (2013.01); *H03K 19/00384* (2013.01)

(58) Field of Classification Search
CPC ...................................................... G01R 19/00
See application file for complete search history.

(56) References Cited

U.S. PATENT DOCUMENTS

| | | | |
|---|---|---|---|
| 6,064,555 | A | 5/2000 | Czajkowski et al. |
| 7,138,820 | B2 | 11/2006 | Goetting et al. |
| 7,230,445 | B1 | 6/2007 | Goetting et al. |
| 7,233,532 | B2 | 6/2007 | Vadi et al. |
| 7,235,999 | B2 | 6/2007 | Goetting et al. |
| 7,599,299 | B2 | 10/2009 | Goetting et al. |
| 7,805,593 | B1 | 9/2010 | Donlin |
| 7,933,277 | B1 | 4/2011 | Schumacher et al. |
| 8,572,432 | B1 | 10/2013 | Parlour et al. |

(Continued)

OTHER PUBLICATIONS

Li, P.W., et al. "A New Analyzing Method of Single Event Latch-Up Protection Circuit Based on Current Comparing and Its Performance Verification", Journal of Modern Physics, 5, 2014, 387-393.

(Continued)

*Primary Examiner* — Albert Wang
(74) *Attorney, Agent, or Firm* — Steven E. Roberts

(57) ABSTRACT

Methods and apparatus are described for detecting both single event latch-up (SEL) and electrical overvoltage stress (EOS) using a single, reconfigurable detection circuit. One example circuit capable of detecting a latch-up state and an overvoltage condition generally includes an impedance element coupled to a power supply node; a voltage divider coupled to the power supply node; a multiplexer having a first input coupled to a tap of the voltage divider, a second input coupled to a first portion of the impedance element, and a third input coupled to a second portion of the impedance element; a reference generator; and an analog-to-digital converter (ADC) having a first input coupled to an output of the multiplexer and a second input coupled to an output of the reference generator.

20 Claims, 6 Drawing Sheets

(56) References Cited

U.S. PATENT DOCUMENTS

| | | |
|---|---|---|
| 9,304,174 B1 | 4/2016 | Taylor et al. |
| 9,419,624 B2 | 8/2016 | Lesea |
| 2005/0187642 A1* | 8/2005 | Kuo ........................ G05B 15/02 |
| | | 700/1 |
| 2018/0175033 A1* | 6/2018 | Zhang ................. G11C 11/4125 |

OTHER PUBLICATIONS

U.S. Appl. No. 15/058,014, filed Mar. 1, 2016, Lesea, Austin H.
Xilinx, Inc. Ultrascale Architecture System Monitor, User Guide, UG580 (v1.7) Dec. 20, 2016, 111 pgs, http://ww.xilinx.com/support/documentation/user_guides/ug580-ultracale-sysmon.pdf.

* cited by examiner

CONFIGURABLE SINGLE EVENT LATCH-UP (SEL) AND ELECTRICAL OVERVOLTAGE STRESS (EOS) DETECTION CIRCUIT

TECHNICAL FIELD

Examples of the present disclosure generally relate to integrated circuits (ICs) and, more particularly, to a circuit capable of detecting both single event latch-up (SEL) and electrical overvoltage stress (EOS).

BACKGROUND

A latch-up is a type of short circuit that can occur in a metal-oxide semiconductor field-effect transistor (MOSFET) circuit, such as complementary metal-oxide semiconductor (CMOS) circuits in an integrated circuit (IC). More specifically, a latch-up is the unintentional creation of a low-impedance path between the power supply rails of a MOSFET circuit. This inadvertent low-impedance path activates a parasitic structure, which disrupts proper functioning of the circuit and causes overcurrent that can potentially destroy the circuit. Power cycling the MOSFET circuit may correct the latch-up in some cases, while in other cases, proper functioning of the circuit may be unrecoverable (e.g., if the latch-up is not removed in time and the circuit is permanently damaged).

One type of latch-up is known as a single event latch-up (SEL), which is typically caused by radiation, for example, of heavy ions or protons from cosmic rays or solar flares. SEL can be extremely hazardous to electronics in space, causing permanent damage to ICs in a short amount of time due to the high currents involved. The risk of SEL prevents many contemporary commercial ICs—including field-programmable gate arrays (FPGAs), complex programmable logic devices (CPLDs), other types of programmable ICs, application-specific integrated circuits (ASICs), and system-on-chips (SoCs)—from being employed in aerospace, deep space, and earth orbiting applications (e.g., in satellites and spacecraft).

SUMMARY

One example of the present disclosure is a circuit capable of detecting a latch-up state and an overvoltage condition. The circuit generally includes an impedance element coupled to a power supply node; a voltage divider coupled to the power supply node; a multiplexer having a first input coupled to a tap of the voltage divider, a second input coupled to a first portion of the impedance element, and a third input coupled to a second portion of the impedance element; a reference generator; and an analog-to-digital converter (ADC) having a first input coupled to an output of the multiplexer and a second input coupled to an output of the reference generator.

Another example of the present disclosure is a method of operating a circuit capable of detecting a latch-up state and an overvoltage condition. The method generally includes controlling a multiplexer to output an indication of a current through a impedance element coupled to a power supply node, wherein: the multiplexer has a first input coupled to a tap of a voltage divider coupled to the power supply node, a second input coupled to a first portion of the impedance element, and a third input coupled to a second portion of the impedance element; and controlling the multiplexer comprises selecting at least one of the second input or the third input; converting the indication of the current through the impedance element to a first digital signal; and processing the first digital signal to detect a latch-up associated with the power supply node.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

DETAILED DESCRIPTION

Figure 1:
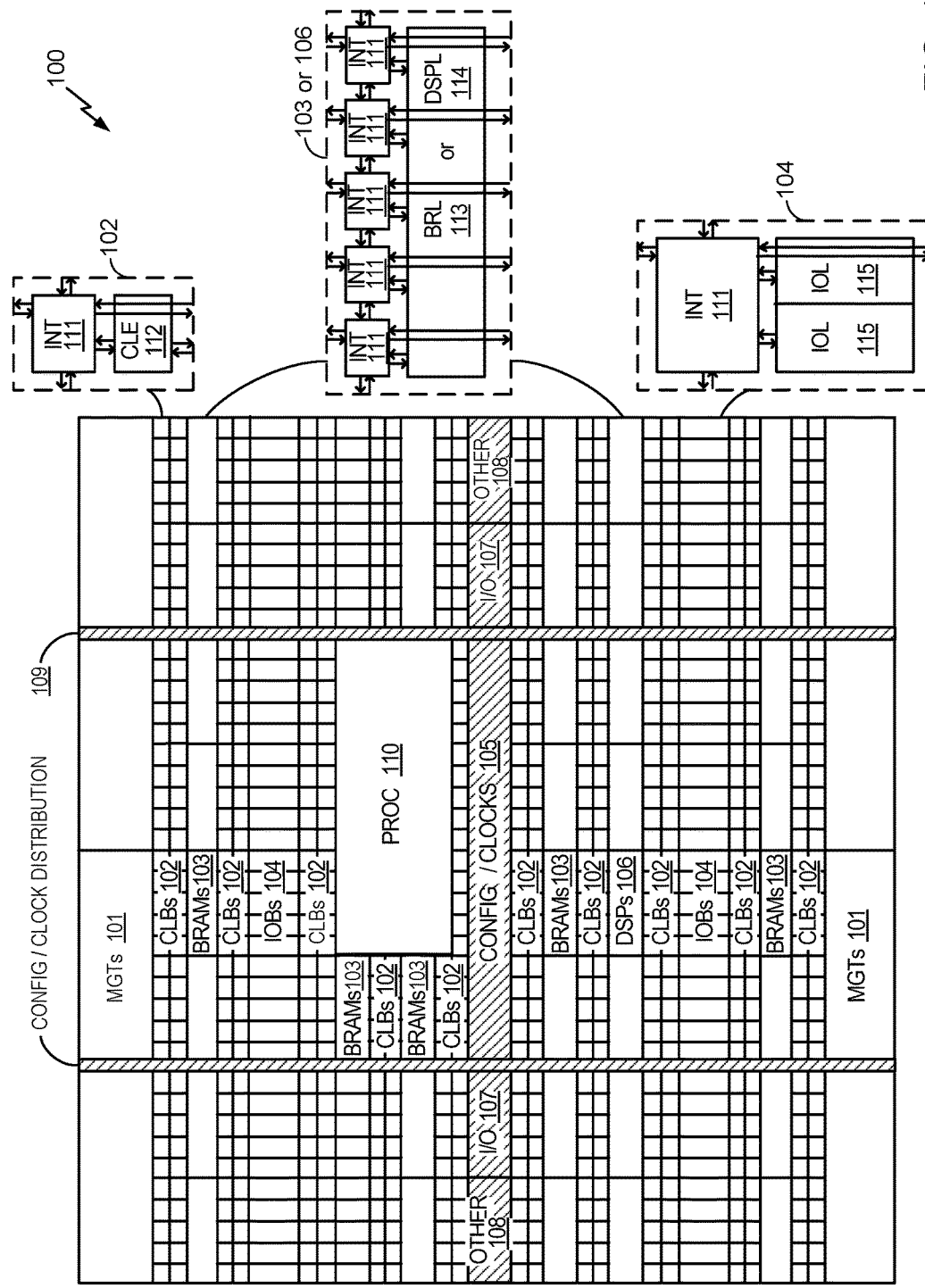
FIG. 1 is a block diagram illustrating an example architecture for a programmable device, in accordance with an example of the present disclosure.

Examples of the present disclosure provide techniques and apparatus for detecting both single event latch-up (SEL) and electrical overvoltage stress (EOS) using a single, reconfigurable detection circuit. Such a detection circuit may be used for monitoring the power supply rails of any complementary metal-oxide semiconductor (CMOS) circuit, and may be distributed throughout an integrated circuit (IC) (e.g., a programmable IC, an application-specific integrated circuit (ASIC), or a system-on-chip (SoC)) to monitor various power supply nodes for SEL and EOS in multiple locations.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well-known features have not been described in detail so as not to obscure the description of the examples herein. For ease of illustration, the same reference numerals are used in different figures to refer to the same items; however, in alternative examples, the items may be different.

Example Programmable Device Architecture

FIG. 1 is a block diagram illustrating an example architecture 100 for a programmable device, in accordance with an example of the present disclosure. Although the SEL and EOS detection circuit described herein may be distributed throughout such a programmable device, it is to be understood that the detection circuit may also be utilized in any of various suitable ICs, including other types of programmable devices, ASICs, or SoCs, for example.

The architecture 100 may be implemented within a field programmable gate array (FPGA), for example. As shown, the architecture 100 includes several different types of programmable circuitry, e.g., logic blocks. For example, the architecture 100 may include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing (DSP) blocks 106, specialized I/O blocks 107 (e.g., configuration ports and clock ports), and other programmable logic 108, such as digital clock managers, analog-to-digital converters (ADCs), system monitoring logic, and the like.

In some FPGAs, each programmable tile includes a programmable interconnect element (INT) 111 having standardized connections to and from a corresponding INT 111 in each adjacent tile. Therefore, the INTs 111, taken together, implement the programmable interconnect structure for the illustrated FPGA. Each INT 111 also includes the connections to and from the programmable logic element within the same tile, as shown by the examples included at the far right of FIG. 1.

For example, a CLB 102 may include a configurable logic element (CLE) 112 that can be programmed to implement user logic plus a single INT 111. A BRAM 103 may include a BRAM logic element (BRL) 113 in addition to one or more INTs 111. Typically, the number of INTs 111 included in a tile depends on the width of the tile. In the pictured example, a BRAM tile has the same width as five CLBs, but other numbers (e.g., four) can also be used. A DSP block 106 may include a DSP logic element (DSPL) 114 in addition to an appropriate number of INTs 111. An 10B 104 may include, for example, two instances of an I/O logic element (IOL) 115 in addition to one instance of an INT 111. As will be clear to a person having ordinary skill in the art, the actual I/O pads connected, for example, to the IOL 115 typically are not confined to the area of the IOL 115.

In the example architecture 100 depicted in FIG. 1, a horizontal area near the center of the die (shown shaded in FIG. 1) is used for configuration, clock, and other control logic (CONFIG/CLOCKS 105). Other vertical areas 109 extending from this central area may be used to distribute the clocks and configuration signals across the breadth of the FPGA.

Some FPGAs utilizing the architecture 100 illustrated in FIG. 1 include additional logic blocks that disrupt the regular row structure making up a large part of the FPGA. The additional logic blocks may be programmable blocks and/or dedicated circuitry. For example, a processor block depicted as PROC 110 spans several rows of CLBs 102 and BRAMs 103.

The PROC 110 may be implemented as a hard-wired processor that is fabricated as part of the die that implements the programmable circuitry of the FPGA. The PROC 110 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 110 may include one or more cores (e.g., central processing units), cache memories, a memory controller, unidirectional and/or bidirectional interfaces configurable to couple directly to I/O pins (e.g., I/O pads) of the IC and/or couple to the programmable circuitry of the FPGA. The phrase "programmable circuitry" can refer to programmable circuit elements within an IC (e.g., the various programmable or configurable circuit blocks or tiles described herein) as well as the interconnect circuitry that selectively couples the various circuit blocks, tiles, and/or elements according to configuration data that is loaded into the FPGA. For example, portions shown in FIG. 1 that are external to the PROC 110 may be considered part of the, or the, programmable circuitry of the FPGA.

FIG. 1 is intended to illustrate an example architecture 100 that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 1 are purely exemplary. In an actual FPGA, for example, more than one adjacent row of CLBs 102 is typically included wherever the CLBs appear, in an effort to facilitate the efficient implementation of a user circuit design. The number of adjacent CLB rows, however, can vary with the overall size of the FPGA. Further, the size and/or positioning of the PROC 110 within the FPGA is for purposes of illustration only and is not intended as a limitation of the one or more examples of the present disclosure.

Example Configurable SEL and EOS Detection Circuit

Single event latch-up (SEL) is a growing problem for electronic circuitry implemented in complementary metal-oxide semiconductor (CMOS) deep sub-micron processes being used in radiation-exposed environments, especially as CMOS geometries continue to shrink. The resulting latch-up state can be reversible if caught in time, but can be destructive if not diagnosed and no corrective action is taken. While FPGAs are used extensively in aerospace applications, this issue affects not only FPGA products, but any CMOS electronic product operating in an aerospace application. Aerospace products have stringent reliability and safety specifications, and any method of detecting, diagnosing, recording, and/or correct potential reliability problems offers significant benefits for these products. Furthermore, being able to detect electrical overvoltage (stress) and surge currents is valuable for electronic device manufacturers to ensure reliability of parts and for failure analysis.

Examples of the present disclosure provide techniques and apparatus for detecting latch-up states, overvoltage conditions, and surge currents.

Figure 2:
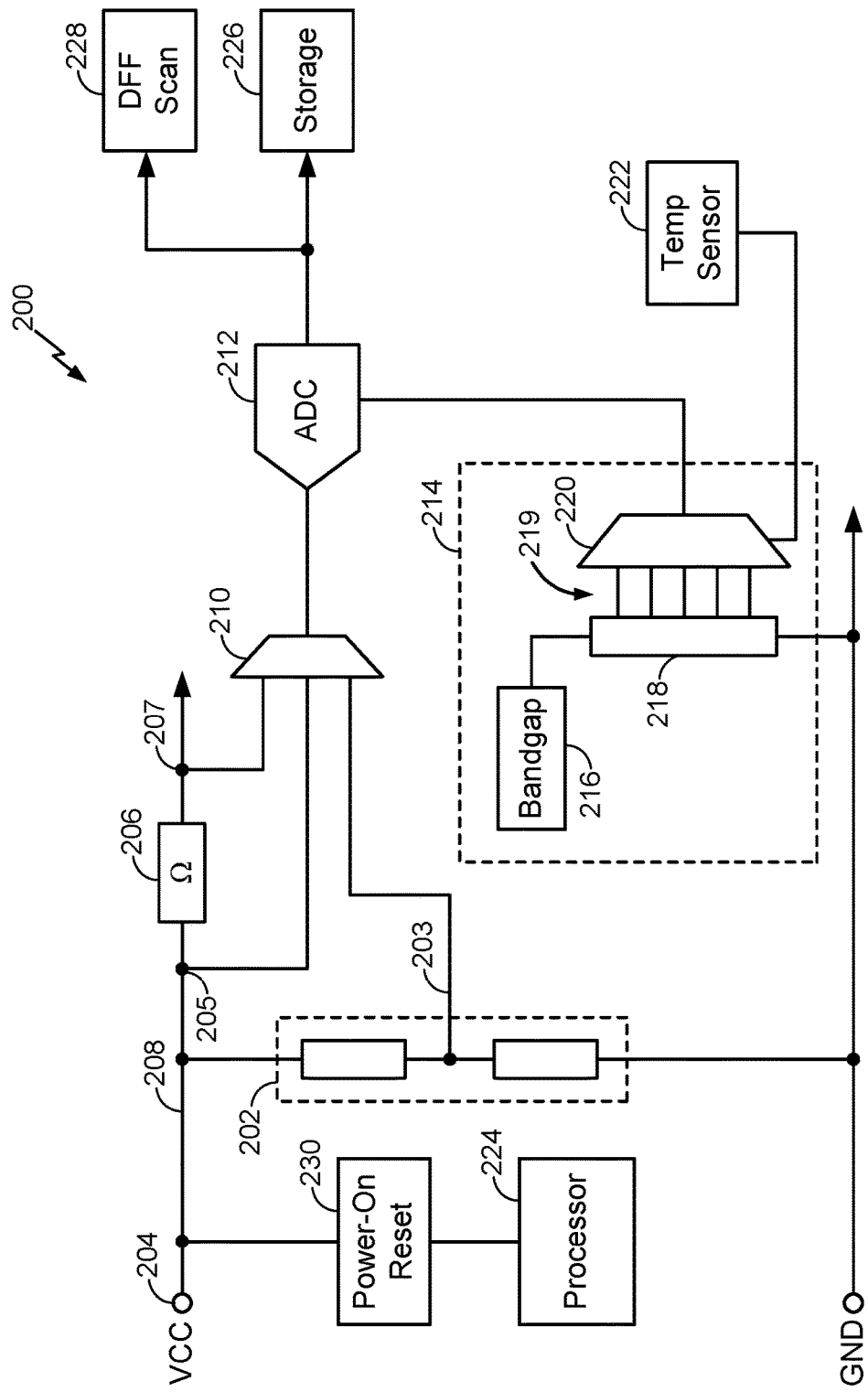
FIG. 2 is a block diagram of an example circuit capable of detecting a latch-up state and an overvoltage condition, in accordance with an example of the present disclosure.

FIG. 2 is a block diagram of an example circuit 200 capable of detecting latch-up states, overvoltage conditions, and surge currents, in accordance with an example of the present disclosure. Such a circuit may be used in any CMOS device. For some examples, the circuit 200 may be distributed throughout an FPGA (such as the architecture 100 of FIG. 1), an ASIC, or an SoC to monitor various power supply nodes, including power supply nodes derived from the same power supply regulator and having the same voltage.

The circuit 200 can be configured to detect SEL, EOS, or surge currents by reconfiguring the circuit for different detection modes. Based on the detection signal, the circuit 200 and/or the customer can take corrective action.

The circuit 200 includes a voltage divider 202 (also referred to as a "potential divider") coupled to a power supply node 204 (labeled "VCC") desired to be monitored, for detecting overvoltages. The voltage divider 202 may include two or more resistive elements with a tap 203 between adjacent elements. The circuit 200 also includes an impedance element 206 for measuring surge or SEL currents. For some examples, the impedance element 206 may be implemented with an actual resistor (e.g., a dedicated current-sensing resistor) or an actual inductor. For the case of an inductor, the abnormally high transient current of SEL may generate a significant transient voltage across the inductor, which can be detected. For other examples, the impedance element 206 may be the small power grid parasitic resistance (e.g., 0.05 to 0.10Ω) that exists, for example, between any two points (e.g., points 205, 207) in the power supply line 208 coupled to the power supply node 204. Measuring the voltage at the two points 205, 207 on either side of the impedance element 206 allows for effectively measuring current through the impedance element, assuming a resistance and/or a reactance of the impedance element is known. The circuit 200 also includes a selection circuit 210 (e.g., a multiplexer) for selecting between the tap 203, the first point 205, and the second point 207 to effectively change the detection mode between EOS and SEL/surge current detection modes. The control input for controlling the selection circuit 210 based on the desired detection mode may be provided by a system monitor (not shown) for a device with the circuit 200 or a processor 224. By controlling the selection circuit 210, the circuit 200 can switch between voltage detection and current detection.

The circuit 200 also includes an analog-to-digital converter (ADC) 212 or a comparator, which can be considered as a 1-bit ADC by persons having ordinary skill in the art. One input of the ADC 212 is coupled to the output of the selection circuit 210, such that the ADC functions as the detector for the various detection modes. A comparator can be used for fast path detection, whereas an ADC with more than 1-bit resolution can allow capture of information (e.g., the signature of an SEL or surge current) at the expense of latency and speed. Capturing current signatures can assist in event causation analysis, whether an event was caused by SEL or not. For some examples, the ADC 212 may be part of a system monitor (not shown) for a device with the circuit 200.

The circuit 200 also includes a reference generator 214, whose output is provided as a reference voltage for the ADC 212 (or a threshold voltage for the comparator). The reference generator 214 may be implemented with a bandgap voltage reference 216 and a resistor ladder 218, for example. The bandgap voltage reference 216 may be insensitive to process, voltage, and temperature (PVT). The resistor ladder 218 may be implemented with a series of two or more resistors and may have multiple taps 219, each tap between pairs of adjacent resistors. The reference generator 214 may also include a selection circuit 220 (e.g., a multiplexer) for selecting between the taps 219 to effectively change the reference voltage output from the reference generator. In this manner, the reference voltage may be dynamically varied.

For some examples, the circuit 200 may include a temperature sensor 222 configured to measure the temperature of the circuit. The temperature measured by the sensor 222 may be used to control the selection circuit 220. SEL detection is temperature-dependent; thus, the circuit 200 may provide for adjustable temperature-dependent thresholds for SEL detection. The reference voltage may also be adjusted dynamically based on temperature for EOS and/or surge current detection, if desired. For some examples, the temperature sensor 222 may be part of a system monitor (not shown) for a device with the circuit 200, and the system monitor may process the temperature and control the selection circuit 220 based on the temperature. For other examples, the output of the temperature sensor 222 may be processed by a processor (e.g., processor 224), and the processor may output a control signal for controlling the selection circuit 220. For other examples, an output from the temperature sensor 222 may be connected to the control input of the selection circuit 220. All of these and other examples may be considered as an output of the temperature sensor 222 being coupled to a control input of the selection circuit 220.

For some examples, the circuit 200 may include a storage device 226, such as nonvolatile memory (NVM) or programmable electronic fuses (eFuses), to store event history. The storage device 226 may be coupled to the output of the ADC, for example, through the processor 224 or the system monitor. For some examples, the circuit 200 may include a scan chain 228, which may be implemented with a series of flip-flops (e.g., delay (D) flip-flops). Using the scan chain 228, the stored event history can be read out for certain events.

For some examples, the circuit 200 may include a power-on reset (POR) 230. As used herein, a "power-on reset" is an electronic device that detects the power applied to a circuit and generates a reset pulse for the circuit, placing the circuit into a known state. The POR 230 may be used to differentiate surge currents due to start-up events and power resets from SEL events during normal operation. The POR 230 may be part of a system monitor (not shown) for a device with the circuit 200, coupled to such a system monitor, or coupled to a processor 224. For some examples, the POR 230 may be part of or coupled to the same processor to which the ADC 212 is part of or coupled.

The circuit 200 uses a combination of circuit techniques to detect an overvoltage or a surge current, possibly due to an SEL. The circuit 200 has programmable threshold detection levels that can be set by the customer or the manufacturer (e.g., by Xilinx, Inc. of San Jose, Calif.). The current is detected across a sensing impedance element (e.g., a resistive element), which can be measured during wafer test (e.g., wafer test of the device incorporating the circuit 200, such as an FPGA). The threshold detection levels may be dynamically set using a combination of feedback from built-in temperature monitors (e.g., temperature sensor 222), power-on reset circuits (e.g., POR 230), and customer data of the expected average currents. Based on this information, the circuit 200 can differentiate an operating mode surge current (e.g., an SEL event) from a power up (or power down) surge current by incorporating the power-on reset device. When the detection is implemented with an ADC (rather than a comparator), the signature of the current may be characterized to analyze the current's root cause (whether latch-up or not). The option of configuring the circuit 200 as an EOS detection circuit provides the circuit with an added advantage to detect when voltages are driven beyond their rated values. Based on the detected EOS signal, corrective action may be taken by the circuit 200 or the customer if desired.

Figure 3:
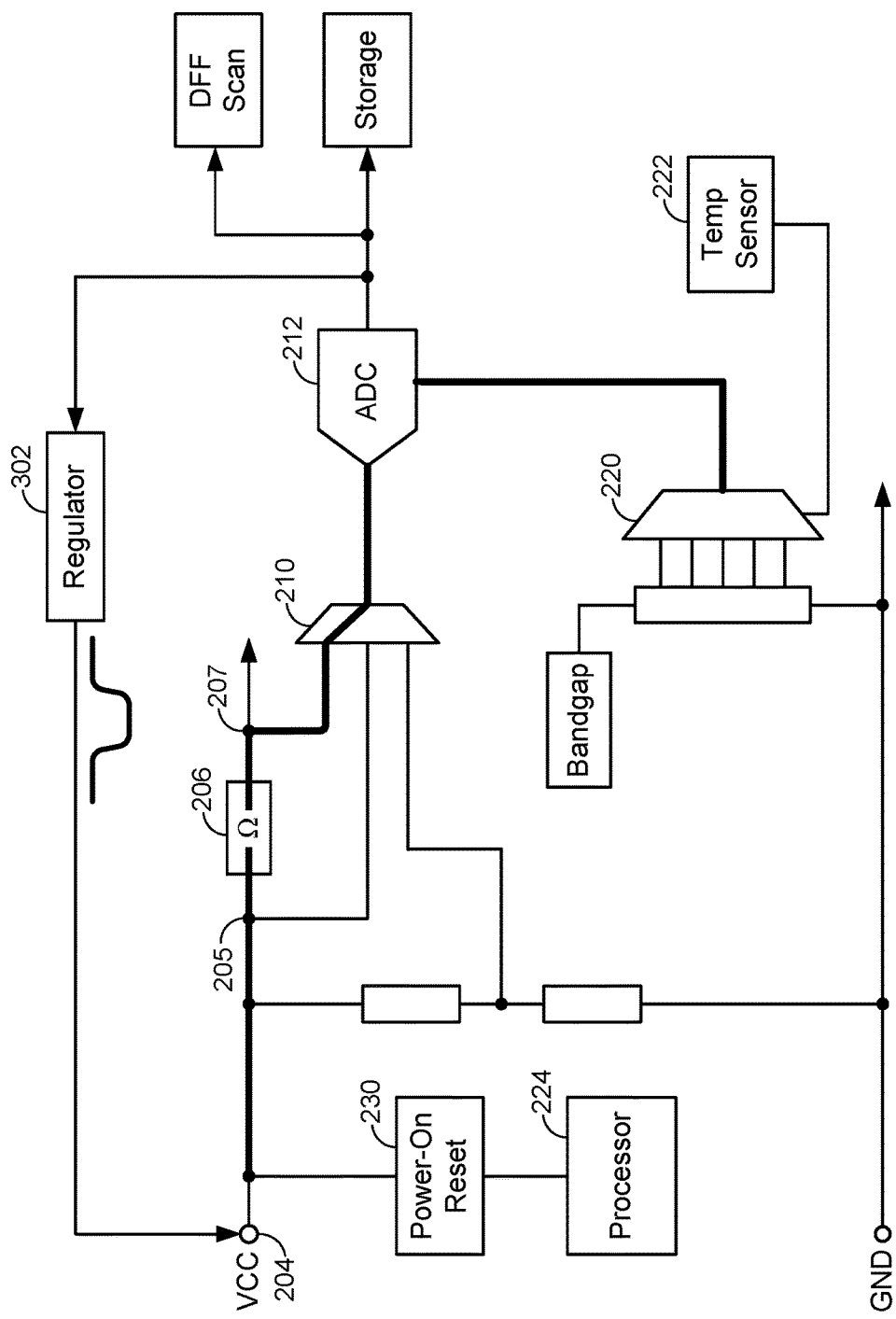
FIG. 3 illustrates latch-up state detection in the block diagram of FIG. 2, in accordance with an example of the present disclosure.

FIG. 3 illustrates latch-up state detection in the block diagram of FIG. 2, in accordance with an example of the present disclosure. In SEL or surge current detection mode, the selection circuit 210 is configured to measure the current through the impedance element 206, by measuring the voltages at points 205, 207. For some examples, these two points 205, 207 may be measured sequentially through the selection circuit 210 (e.g., a multiplexer) in a single-ended implementation of the ADC 212, as illustrated. The difference between the two voltage measurements can be used to calculate the current based on the known resistance and/or reactance of the impedance element 206. For other examples, the ADC 212 may be implemented differentially, and the voltages at these two points 205, 207 can be measured concurrently as a differential input to the ADC.

The output of the POR 230 is used to determine whether a relatively high current (a surge current) is due to an SEL event during normal operation (with a lack of a reset pulse from the POR within an interval before the high current event) or is due to an in-rush current event during power up or reset (with the presence of the reset pulse during this interval). As described above, the temperature sensor 222 and/or a processor can be used to set the reference voltage (or the threshold voltage in the case of a comparator) from the reference generator 214 for accurate SEL detection over variations in temperature. This reference voltage can be changed dynamically as the temperature changes. SEL occurs more frequently at higher temperature due to the negative temperature coefficient of the effective bipolar junction transistors (BJTs)—forming the silicon-controlled rectifier (SCR) in the CMOS circuits of the device—and higher well resistance with higher temperature. Monitoring the device temperature (e.g., using the temperature sensor 222) yields temperature information that can be used to change the reference voltage (e.g., the comparator detection threshold) at different temperatures to increase the SEL detection accuracy.

Where a customer's average power consumption is deterministic and known, this information can be used to set the programmable detection thresholds (e.g., the reference voltage) to differentiate an unwanted surge current event from an acceptable surge current event (e.g., due to a power cycle, reset, or other normal operation).

Alarms indicating an SEL detection can be soft (e.g., indicating that the SEL event was detected) or hard (e.g., shutting down the device). These operations following SEL detection can be determined by the manufacturer of the device with the circuit 200 or by the customer.

For some examples, a voltage regulator 302 may be coupled to control the power supply voltage at the power supply node 204. The voltage regulator 302 may be external to the circuit 200 for some examples or internal to the circuit for other examples (e.g., an internal or external power supply regulator). When an SEL event is detected by the circuit 200, the system monitor, the processor 224, or the output of the ADC 212 may send a trigger signal to the voltage regulator 302. In response to the received trigger signal, the voltage regulator 302 temporarily lowers the power supply voltage as illustrated for a period in an effort to correct the latch-up state. The power supply voltage may be dropped to a potential lower than two base-to-emitter voltages ($2*V_{BE}$) (e.g., <1.4 V) such that the effective SCR in the CMOS circuits of the device is made to exit forward conduction mode (and hence, the latch-up state), effectively power cycling this power supply.

Figure 4:
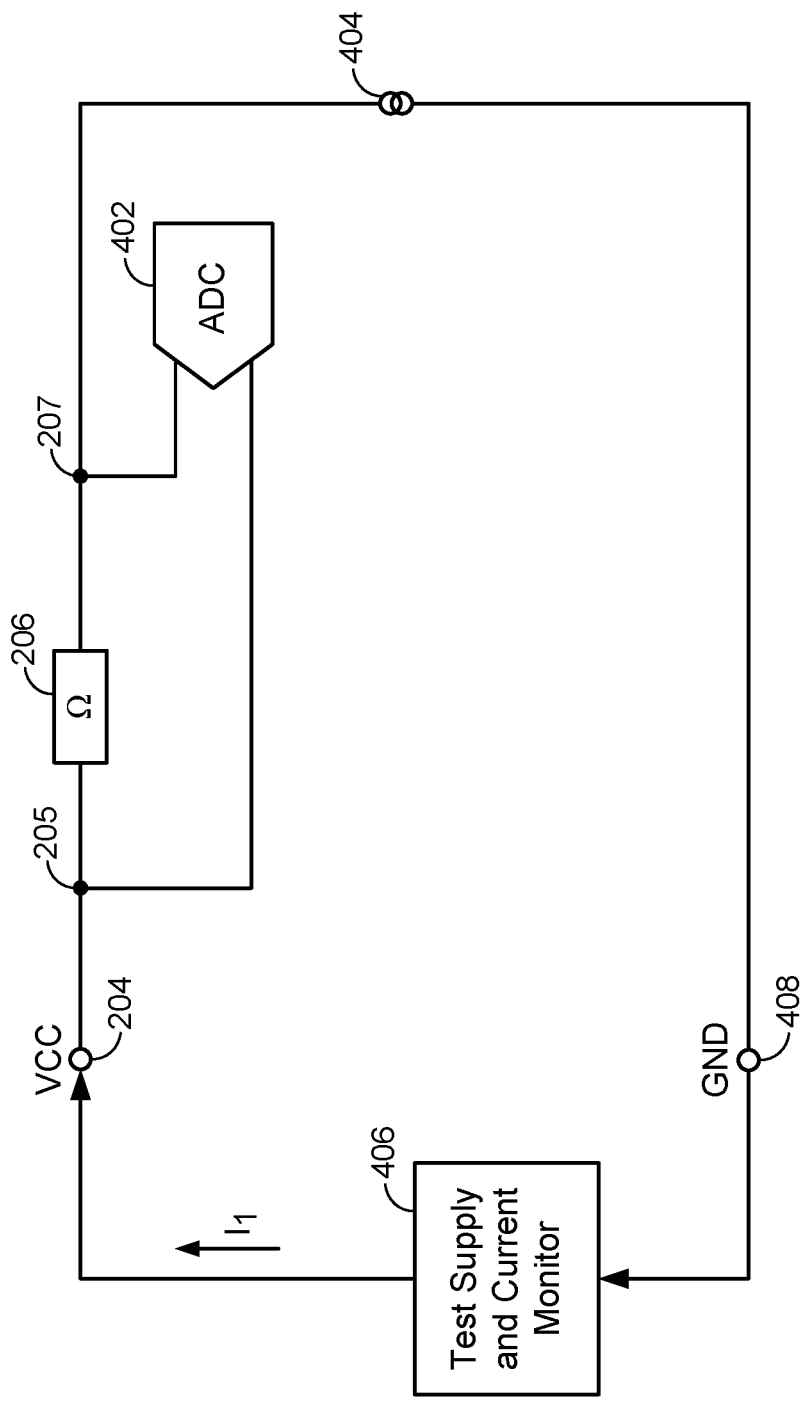
FIG. 4 illustrates example resistance measurement for the impedance element in the block diagram of FIG. 2, in accordance with an example of the present disclosure.

FIG. 4 illustrates example resistance measurement for the impedance element 206 in the circuit 200 of FIG. 2, in accordance with an example of the present disclosure. The resistance of the impedance element 206 (e.g., in the case of the parasitic power grid resistance) can be determined at production or wafer test by measuring the current*resistance (IR) drop using an ADC 402. The ADC 402 may be internal to the device, and may be the same as or different from the ADC 212. The power grid resistance may typically range from 50 to 100 mΩ. Such a resistance can be accurately measured using the arrangement in FIG. 4, assuming an ADC with sufficient resolution. At wafer or production test, a test supply 406 (e.g., an external voltage supply, external to the device with the circuit 200) is applied to the power supply node 204. A current sink 404 is enabled to provide a complete circuit for current $I_1$ generated by the test supply 406 to flow through the power supply node 204, the impedance element 206, the current sink 404, the power supply node 408 (e.g., electrical ground, labeled "GND"), and back to the test supply. The test supply 406 may also be capable of probing the current $I_1$. The ADC 402 is used to measure the voltages at the two points 205, 207, which provides the voltage drop across the impedance element 206. Based on the measured current $I_1$, the resistance of the impedance element 206 can be calculated by dividing the voltage drop by the measured current $I_1$. For some examples, these two points 205, 207 may be measured concurrently as a differential input to the ADC 402, as illustrated. For other examples, these two points 205, 207 can be measured sequentially through a multiplexer in a single-ended implementation, and the difference between the two measurements may be used for the calculations.

The parasitic power grid resistance has a very low temperature coefficient and drift. Once the resistance is determined and stored, accurate current detection can be achieved during operation of the circuit 200 at various temperatures.

Figure 5:
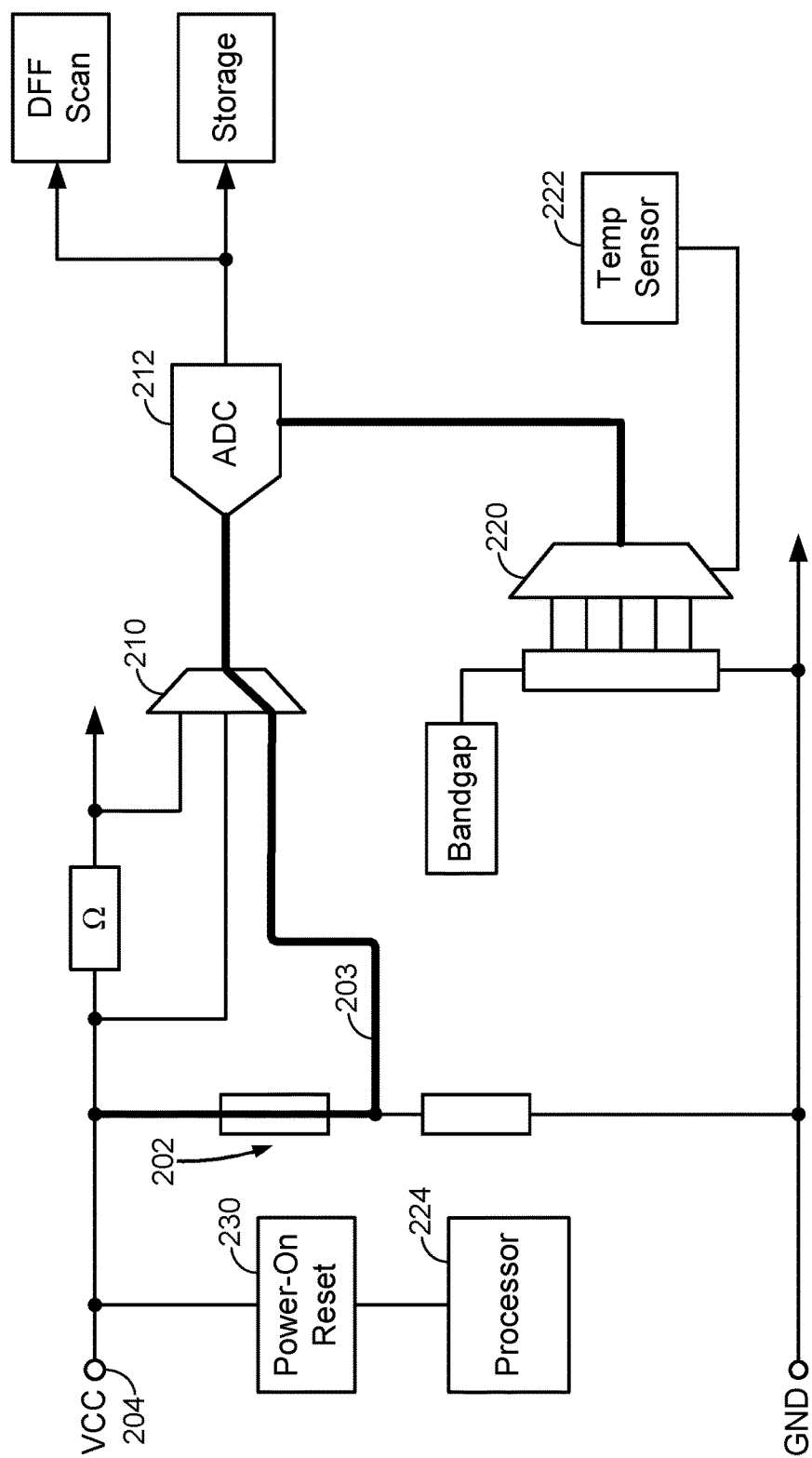
FIG. 5 illustrates overvoltage condition detection in the block diagram of FIG. 2, in accordance with an example of the present disclosure.

FIG. 5 illustrates overvoltage condition detection in the block diagram of FIG. 2, in accordance with an example of the present disclosure. In overvoltage condition detection mode, the selection circuit 210 is configured to measure the voltage of the tap 203, which is proportional to and indicative of the power supply voltage at the node 204. Detection of overvoltage conditions may be desired when customers drive power supplies to incorrect voltages. For some examples, the circuit 200 may be coupled to each die power supply. The detection of the overvoltage condition may be stored in the storage device 226 to assist failure analysis of returned parts. For some examples, overvoltage detection can be used for safe powering down of the device. As described above, the detector can be a comparator for low latency or a multi-bit ADC, which would allow for signature definition and measurement of the overvoltage event (e.g., the amount of overvoltage).

As presented herein, examples of the present disclosure provide an integrated joint reconfigurable EOS/SEL detection circuit. Some examples implement the current-sensing resistor as the on-die power network parasitic supply resistance, which can be accurately measured at wafer or production test. Other examples implement the current-sensing resistor as a dedicated resistor. Examples of the present disclosure may also monitor the device temperature, which may be used to dynamically set SEL threshold levels, which can offer more accurate SEL detection capability. Examples of the present disclosure may also differentiate start-up currents from an SEL event by having an integrated POR that defines the state of the power supply being detected.

Example Operations of a Configurable SEL and EOS Detection Circuit

Figure 6:
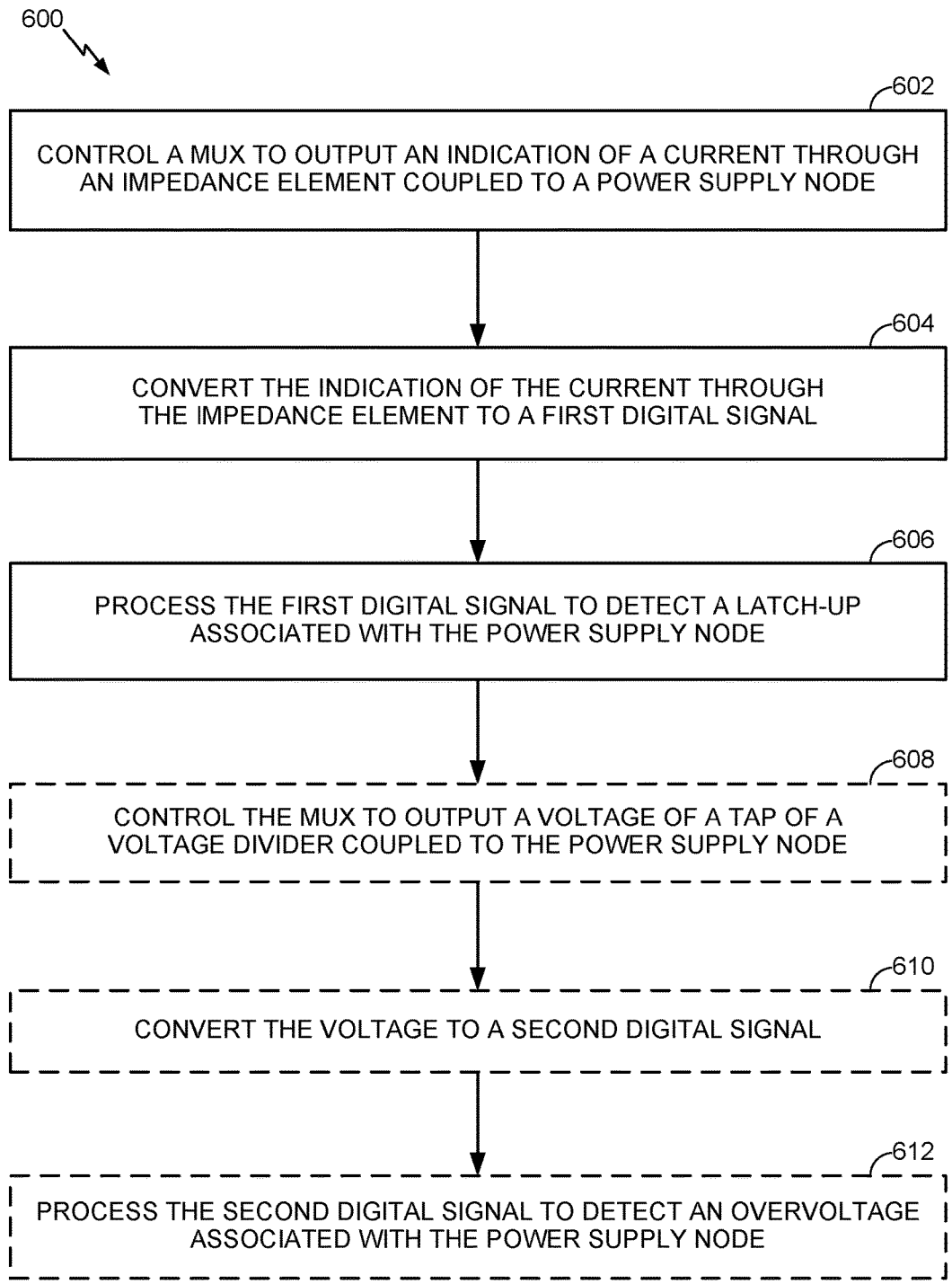
FIG. 6 is a flow diagram of example operations for operating a circuit capable of detecting a latch-up state and an overvoltage condition, in accordance with an example of the present disclosure.

FIG. 6 is a flow diagram of example operations 600 for operating a circuit capable of detecting a latch-up state (e.g., a SEL) and an overvoltage condition (e.g., an EOS). The operations 600 may be performed, for example, by the circuit 200 of FIG. 2.

The operations 600 may begin, at block 602, by controlling a multiplexer (e.g., selection circuit 210) to output an indication of a current through an impedance element (e.g., impedance element 206) coupled to a power supply node (e.g., power supply node 204). The multiplexer may have a first input coupled to a tap (e.g., tap 203) of a voltage divider (e.g., voltage divider 202) coupled to the power supply node, a second input coupled to a first portion (first point 205) of the impedance element, and a third input coupled to a second portion (second point 207) of the impedance element. In this case, controlling the multiplexer at block 602 may entail selecting at least one of the second input or the third input. For example, the second input and the third input may be selected sequentially, such that either the second input or the third input is selected first, followed by the other input.

At block 604, the indication of the current through the impedance element is converted to a first digital signal (e.g., by the ADC 212). At block 606, the first digital signal is processed (e.g., in a system monitor or other processor) to detect a latch-up associated with the power supply node.

According to some examples, the operations 600 further involve controlling the multiplexer to output a voltage of the tap of the voltage divider at block 608, converting the voltage to a second digital signal at block 610, and processing the second digital signal to detect an overvoltage associated with the power supply node at block 612. For some examples, processing the second digital signal at block 612 includes determining that the circuit was power-cycled within an interval before the detection of the overvoltage and ignoring the overvoltage based on the determination.

According to some examples, the operations 600 further entail controlling a reference generator (e.g., reference generator 214) to output a reference voltage. In this case, the converting at block 604 may be based on the reference voltage. For some examples, the operations 600 may further involve sensing a temperature of the circuit (e.g., using temperature sensor 222). In this case, the reference generator may be controlled by adjusting the reference voltage based on the sensed temperature. The reference voltage may be adjusted to establish the threshold settings for the SEL and/or EOS events, which are temperature dependent. For some examples, the reference generator includes a bandgap voltage reference (e.g., bandgap voltage reference 216) coupled to another voltage divider (e.g., resistor ladder 218). In this case, adjusting the reference voltage may entail selecting a tap (e.g. one of the taps 219) of the other voltage divider.

According to some examples, the impedance element comprises a parasitic resistance in a power supply line (e.g., line 208) coupled to the power supply node.

According to some examples, the operations 600 further include storing the first digital signal over a period to capture the latch-up (e.g., in a storage device 226). The first digital signal may be stored in NVM or one or more eFuses, as described above.

According to some examples, the operations 600 further involve controlling, based on the detection of the latch-up, a power supply regulator (e.g., voltage regulator 302) to temporarily lower a power supply voltage of the power supply node to correct the latch-up.

According to some examples, processing the first digital signal at block 606 includes calculating the current through the impedance element based on at least one of a predetermined resistance or a predetermined reactance of the impedance element and the indication of the current.

Any of the operations described above, such as the operations 600, may be included as instructions in a computer-readable medium for execution by a processing system, such as the processor 224 or a system monitor in an FPGA or other device. The (non-transitory) computer-readable medium may comprise any suitable memory or other storage device for storing instructions, such as read-only memory (ROM), random access memory (RAM), flash memory, an electrically erasable programmable ROM (EEPROM), a compact disc ROM (CD-ROM), a floppy disk, or a digital versatile disc ROM (DVD-ROM).

As used herein (including the claims that follow), a phrase referring to "at least one of" a list of items refers to any combination of those items, including single members. As an example, "at least one of: x, y, or z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:

1. A circuit capable of detecting a latch-up state and an overvoltage condition, comprising:
   an impedance element coupled to a power supply node;
   a voltage divider coupled to the power supply node;
   a multiplexer having a first input coupled to a tap of the voltage divider, a second input coupled to a first portion of the impedance element, and a third input coupled to a second portion of the impedance element;
   a reference generator; and
   an analog-to-digital converter (ADC) having a first input coupled to an output of the multiplexer and a second input coupled to an output of the reference generator.

2. The circuit of claim 1, wherein the ADC comprises a comparator.

3. The circuit of claim 1, wherein the impedance element comprises a parasitic resistance in a power supply line coupled to the power supply node.

4. The circuit of claim 1, wherein the reference generator comprises:
   a bandgap voltage reference;
   another voltage divider coupled to the bandgap voltage reference; and
   another multiplexer having inputs coupled to taps of the other voltage divider, wherein an output of the other multiplexer is coupled to the second input of the ADC.

5. The circuit of claim 4, further comprising:
   a temperature sensor configured to measure a temperature of the circuit; and
   a processor having an input coupled to an output of the temperature sensor, wherein an output of the processor is coupled to a control input of the other multiplexer and wherein the processor is configured to adjust a reference voltage for the ADC based on the measured temperature.

6. The circuit of claim 1, further comprising:
   a power-on reset having an input coupled to the power supply node; and
   a processor having a first input coupled to the power-on reset and a second input coupled to an output of the ADC.

7. The circuit of claim 1, further comprising a storage device coupled to an output of the ADC.

8. The circuit of claim 1, further comprising a power supply regulator having an input coupled to an output of the ADC, wherein an output of the power supply regulator is coupled to the power supply node.

9. The circuit of claim 1, wherein the impedance element comprises a resistor.

10. An integrated circuit (IC) comprising the circuit of claim 1 for detecting at least one of the latch-up state or the overvoltage condition in the IC.

11. A method of operating a circuit capable of detecting a latch-up state and an overvoltage condition, comprising:
controlling a multiplexer to output an indication of a current through an impedance element coupled to a power supply node, wherein:
the multiplexer has a first input coupled to a tap of a voltage divider coupled to the power supply node, a second input coupled to a first portion of the impedance element, and a third input coupled to a second portion of the impedance element; and
controlling the multiplexer comprises selecting at least one of the second input or the third input;
converting the indication of the current through the impedance element to a first digital signal; and
processing the first digital signal to detect a latch-up associated with the power supply node.

12. The method of claim 11, further comprising:
controlling the multiplexer to output a voltage of the tap of the voltage divider;
converting the voltage to a second digital signal; and
processing the second digital signal to detect an overvoltage associated with the power supply node.

13. The method of claim 12, wherein processing the second digital signal comprises:
determining that the circuit was power-cycled within an interval before the detection of the overvoltage; and
ignoring the overvoltage based on the determination.

14. The method of claim 11, further comprising controlling a reference generator to output a reference voltage, wherein the converting is based on the reference voltage.

15. The method of claim 14, further comprising sensing a temperature of the circuit, wherein controlling the reference generator comprises adjusting the reference voltage based on the sensed temperature.

16. The method of claim 15, wherein the reference generator comprises a bandgap voltage reference coupled to another voltage divider and wherein adjusting the reference voltage comprises selecting a tap of the other voltage divider.

17. The method of claim 11, wherein the impedance element comprises a parasitic resistance in a power supply line coupled to the power supply node.

18. The method of claim 11, further comprising storing the first digital signal over a period to capture the latch-up.

19. The method of claim 11, further comprising controlling, based on the detection of the latch-up, a power supply regulator to temporarily lower a power supply voltage of the power supply node to correct the latch-up.

20. The method of claim 11, wherein processing the first digital signal comprises calculating the current through the impedance element based on at least one of a predetermined resistance or a predetermined reactance of the impedance element and the indication of the current.

* * * * *